United States Patent
Bui et al.

(10) Patent No.: US 12,470,220 B2
(45) Date of Patent: Nov. 11, 2025

(54) LEVEL-SHIFT BUFFER DEVICE, SYSTEM AND OPERATING METHOD THEREOF

(71) Applicant: Winbond Electronics Corp., Taichung (TW)

(72) Inventors: John H. Bui, San Jose, CA (US); Poongyeub Lee, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 40 days.

(21) Appl. No.: 18/620,990

(22) Filed: Mar. 28, 2024

(65) Prior Publication Data
US 2025/0309897 A1    Oct. 2, 2025

(51) Int. Cl.
*H03K 19/0185* (2006.01)

(52) U.S. Cl.
CPC .......................... *H03K 19/018521* (2013.01)

(58) Field of Classification Search
None
See application file for complete search history.

(56) References Cited

U.S. PATENT DOCUMENTS 10,804,884 B1    10/2020    Tsai et al.
2024/0421821 A1*   12/2024    Altolaguirre .. H03K 19/018507

FOREIGN PATENT DOCUMENTS

| CN | 101159430 A | 4/2008 |
|---|---|---|
| CN | 102820880 | 3/2017 |
| TW | 201509133 | 3/2015 |

OTHER PUBLICATIONS

"Office Action of Taiwan counterpart Application", issued on Aug. 25, 2025, p. 1-p. 6.

* cited by examiner

*Primary Examiner* — Jeffrey S Zweizig
(74) *Attorney, Agent, or Firm* — JCIPRNET

(57) ABSTRACT

A level-shift buffer device includes an input buffer circuit, a configurable circuit and a level-shift circuit. The input buffer circuit receives input/output (I/O) supply voltage at a first voltage level among a plurality of voltage levels that are supported by the level-shift buffer device. The input buffer circuit generates a first input signal according to the first voltage level of the I/O supply voltage. The configuration circuit controls at least one transistor of the configurable circuit according to the configuration signal to generate a second input signal. The level-shift circuit generates an output signal at a second voltage level according to the second input signal and the configuration signal, wherein the level-shift circuit functions as an inverter or a level shifter in accordance with the configuration signal.

20 Claims, 3 Drawing Sheets

LEVEL-SHIFT BUFFER DEVICE, SYSTEM AND OPERATING METHOD THEREOF

BACKGROUND

Technical Field

The disclosure relates to a level-shift buffer device and more particularly relates to a level-shift buffer device, a system and an operating thereof that may support various input/output (I/O) voltage levels.

Description of Related Art

A level shifter may generate an output signal having a voltage level different from a voltage level of the input signal, and the level shifter may be utilized to interface electronic circuits (i.e., I/O device and a core logic circuit) with different input voltage levels. The level shifter may be designed to operate with a single input voltage level or with various input voltage levels, alternatively. In a conventional design of the level shifter that supports various input voltage levels, metal options are used to connect a level-shifter circuitry for supporting a first input voltage level or to bypass the level-shifter circuitry for supporting a second input voltage level. However, the inclusion of metal options in the conventional design results in several issues such as performance degradation (i.e., lower operating speed) due to signal rise and fall time skews or duty cycle distortion. The inclusion of the metal options usually requires extra back-end layer metal masks to modify the design, resulting in high manufacturing cost and long time-to-market of a new product.

It is desirable for a novel design of a level-shifter device that may support various input voltage levels and improve performance of the level-shifter device.

SUMMARY

In some embodiments of the disclosure, a level-shift buffer device includes an input buffer circuit, a configurable circuit and a level-shift circuit. The input buffer circuit receives input/output (I/O) supply voltage at a first voltage level among a plurality of voltage levels that are supported by the level-shift buffer device, and generates a first input signal according to the first voltage level of the I/O supply voltage. The configurable circuit receives the first input signal and a configuration signal, and controls at least one transistor of the configurable circuit according to the configuration signal to generate a second input signal. The level-shift circuit generates an output signal at a second voltage level according to the second input signal and the configuration signal, wherein the level-shift circuit functions as an inverter or a level shifter in accordance with the configuration signal.

In some embodiments of the disclosure, an operating method is introduced. The operating method includes steps of setting a configuration signal according to voltage level of an I/O supply voltage among a plurality of voltage levels that are supported by a level-shift buffer device; generating, by an input buffer circuit of the level-shift buffer device, a first input signal according to the I/O supply voltage and the configuration signal; controlling at least one transistor of a configurable circuit of the level-shift buffer device according to the configuration signal to generate a second input signal; performing a logic operation on configuration bits of the configuration signal to generate an enable signal; and controlling at least one transistor of a level-shift circuit of the level-shift buffer device according to the enable signal, wherein the level-shift circuit functions as an inverter or a level shifter in accordance with the enable signal.

In some embodiments of the disclosure, a system including a register/detector circuit, a level-shift buffer device and a control logic circuit is introduced. The register/detector circuit generates a configuration signal. The level-shift buffer device includes an input buffer circuit, a configurable circuit and a level-shift circuit. The input buffer circuit receives input/output (I/O) supply voltage at a first voltage level among a plurality of voltage levels that are supported by the level-shift buffer device, and generates a first input signal according to the first voltage level of the I/O supply voltage. The configurable circuit receives the first input signal and a configuration signal, and controls at least one transistor of the configurable circuit according to the configuration signal to generate a second input signal. The level-shift circuit generates an output signal at a second voltage level according to the second input signal and the configuration signal, wherein the level-shift circuit functions as an inverter or a level shifter in accordance with the configuration signal. control logic circuit is coupled to the level-shift buffer device and operates according to the output signal at the second voltage level.

In accordance with the above embodiments, the level-shift buffer device can support various I/O supply voltage levels in accordance with a configuration signal. An input buffer circuit of the level-shift buffer device may receive I/O supply voltage with various voltage levels. The configuration signal may control at least one transistor of a configurable circuit of the level-shift buffer device to support various I/O supply voltage levels. A level-shift circuit of the level-shift buffer device may function as an inverter or a level shifter according to the configuration signal.

To make the above features and advantages provided in one or more of the embodiments of the disclosure more comprehensible, several embodiments accompanied with drawings are described in detail as follows.

DESCRIPTION OF THE EMBODIMENTS

Figure 1:
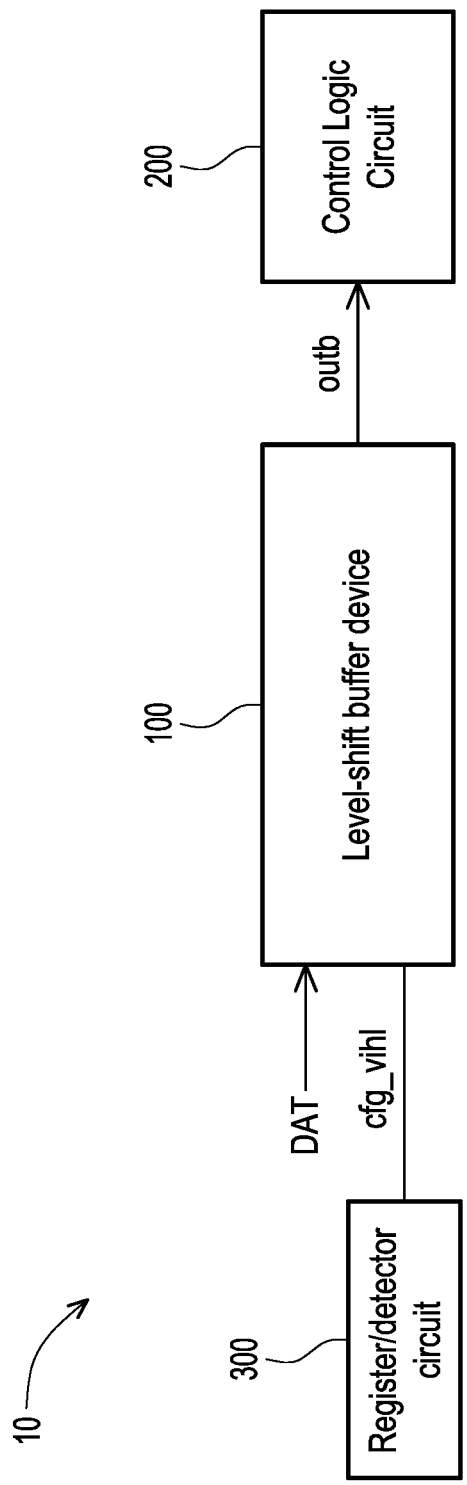
FIG. 1 is a schematic diagram of a system comprising a level-shift buffer device, a control logic circuit and a register/detector circuit in accordance with some embodiments.

References are made in detail to the present preferred embodiments of the invention, examples of which are illustrated in the accompanying drawings. Wherever possible, the same reference numbers are used in the drawings and the description to refer to the same or like parts.

FIG. 1 illustrates a schematic diagram of a system 10 including a level-shift buffer device 100, a control logic circuit 200 and a register/detector circuit 300 in accordance with some embodiments. The register/detector circuit 300 may generate a configuration signal cfg_vihl and provide the generated configuration signal cfg_vihl to the level-shift buffer device 100. The configuration signal cfg_vihl may be a single-bit signal or a multi-bit signal, and bits of the configuration signal cfg_vihl may be set in accordance with the input voltage level (i.e., voltage level of the input data DAT or an I/O supply voltage). The level-shift buffer device 100 may support various input voltage levels. The level-shift buffer device 100 may function as an inverter or a level shifter to match the voltage level of the input data DAT to a voltage level supported by the control logic circuit 200. For example, when the voltage level of the input data DAT is expected to be same as the voltage level of the output signal outb, the level-shift buffer device 100 may be configured according to the configuration signal cfg_vihl to function as the inverter. When the voltage level of the input data DAT is expected to be different from the voltage level of the output signal outb, the level-shift buffer device 100 may be configured according to the configuration signal cfg_vihl to function as the level shifter. In this way, the level-shift buffer device 100 may support various input voltage levels.

The control logic circuit 200 is coupled to the level-shift buffer device 100 to receive the output signal outb. The control logic circuit 200 may include a circuitry that is designed to control an electronic apparatus (i.e., memory device) according to the output signal outb. The disclosure does not intend to limit circuit structure and/or functionality of the control logic circuit 200 to any specific structure or functionality.

Figure 2:
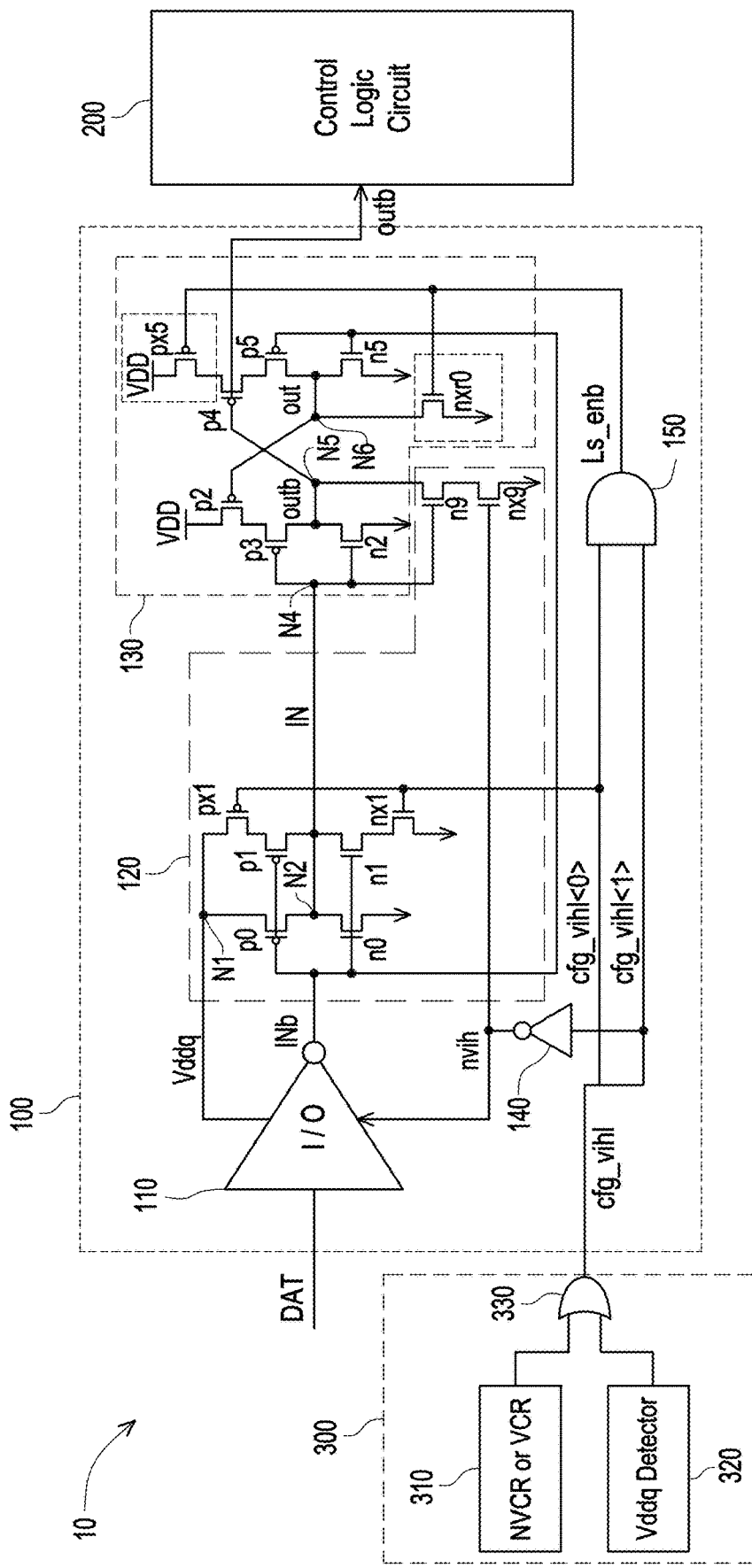
FIG. 2 is a schematic diagram illustrating a detailed structure of a system comprising a level-shift buffer device, a control logic circuit, and a register/detector circuit in accordance with some embodiments.

FIG. 2 illustrates a detailed structure of the system 10 illustrated in FIG. 1 in accordance with some embodiments. The same elements in FIG. 1 and FIG. 2 are illustrated by same reference numbers. Referring to FIG. 2, the register/detector circuit 300 may include a non-volatile configuration register (NVCR) or a volatile configuration register (VCR) 310, a supply voltage detector 320 and a logic circuit 330. The NVCR or VCR 310 may store configuration bits of the configuration signal, in which the configuration bits of the configuration signal is programmable. In other words, the configuration bits of the configuration signal stored in the NVCR or VCR 310 may be set according to the input voltage level (i.e., the voltage level of the input data DAT or the voltage level of the I/O supply voltage Vddq). The NVCR or VCR 310 may output the stored configuration signal to the logic circuit 330. The supply voltage detector 320 is configured to detect a voltage level of the I/O supply voltage Vddq (or the voltage level of the input data DAT). The output of the supply voltage detector 320 may be provided to the logic circuit 330. The logic circuit 330 may perform a logic operation on the output of the NVCR or VCR 310 and the output of the supply voltage detector 320 to generate the configuration signal cfg_vihl. The configuration bits of the configuration signal cfg_vihl may indicate the voltage level of the I/O supply voltage Vddq or the voltage level of the input data DAT. For example, the configuration bits cfg_vihl<1:0> of "11" may indicate that the I/O supply voltage Vddq is a first predefined voltage level (i.e., 1.8V); the configuration bits cfg_vihl<1:0> of "10" may indicate that the I/O supply voltage Vddq is a second predefined voltage level (i.e., 1.2V); and the configuration bits cfg_vihl<1:0> of "00" may indicate that the I/O supply voltage Vddq is a third predefined voltage level (i.e., 0.9V). It is appreciated that the disclosure does not intend to limit the bit number of the configuration signal cfg_vihl and the values of the predefined first, second and third voltage levels to any specific numbers or values.

The level-shift buffer device 100 may include an input buffer circuit 110, a configurable circuit 120, a level-shift circuit 130 and logic circuits 140 and 150. The input buffer circuit 110 may receive the input data DAT, the I/O supply voltage Vddq and a control signal nvih. The input buffer circuit 110 is configured to generate a first input signal INb (also known as an inverted input signal inb) according to the received input data DAT, the I/O supply voltage Vddq and the control signal nvih. The input data DAT may be supplied by electronic device such as a memory device (not shown), and the voltage level of the I/O supply voltage Vddq may correspond to a voltage level of the operating voltage of the electronic device (not shown) that supplies the input data DAT to the input buffer circuit 110. The control signal nvih is generated according to a configuration bit configuration bit <1> of the configuration signal cfg_vihl. For example, the logic circuit 140 may perform a logic operation on the configuration bit <1> of the configuration signal cfg_vihl to generate the control signal nvih. The logic circuit 140 may be an inverter that is configured to invert the configuration bit <1> to generate the control signal nvih. In some embodiments, the control signal nvih is used to enable finger transistors (not shown) of input buffer circuit 110 for lowering a trip voltage of the input buffer circuit 110 to compensate for relatively low voltage level of the I/O supply voltage Vddq. For example, when the I/O supply voltage Vddq is less than or equal to a half of a supply voltage Vdd, the control signal nvih may enable the finger transistors (not shown) of input buffer circuit 110 for lowering the trip voltage of the input buffer circuit 110.

The configurable circuit 120 may receive the first input signal INb and the configuration signal cfg_vihl, and is configured to generate a second input signal IN according to the first input signal INb and the configuration signal cfg_vihl. The configurable circuit 120 may have a plurality of transistors which include a pair of transistors p0, p1, a pair of transistors n0 and n1, and transistors px1, nx1, n9 and nx9. The pair of transistors p0, p1 are coupled between connection nodes N1 and N2 of the configurable circuit 120 in parallel, and are controlled by the first input signal INb. The transistors p0 and p1 is configured to divide a total pull-up current flowing between the connection nodes N1 and N2 into currents with respect to a scaling ratio. The scaling ratio is determined according to design factors (i.e., channel width, size or material) of the transistors p0 and p1.

The pair of transistors n0, n1 are coupled between terminals N2 and ground node GND of the configurable circuit 120 in parallel, and are controlled by the first input signal INb. The transistors n0 and n1 are configured to divide a total pull-down current flowing between the connection node N1 and the ground node GND into currents with respect to a scaling ratio. The scaling ratio is determined according to design factors (i.e., channel width, size or material) of the transistors n0 and n1.

The transistor px1 is coupled to the transistor p1 in series, and the transistor nx1 is coupled to the transistor n1 in series. The transistors px1 and nx1 are controlled by a configuration bit cfg_vihl<0> of the configuration signal cfg_vihl. In some embodiments, the transistors px1 and nx1 are turned on or turned off to support different I/O supply voltage levels. For example, when the I/O voltage level is a first predefined voltage level (i.e., 1.8V), the configuration bit cfg_vihl <0> is configured to turn off the transistor px1 and to turn on the transistor nx1. When the I/O voltage level is a second predefined voltage level (i.e., 1.2V) or a third predefined voltage level (i.e., 0.9V), the configuration bit cfg_vihl <0> is configured to turn on the transistor px1 and to turn off the transistor nx1.

The transistors n9 and nx9 are connected in series between the output node N5 of the level-shift circuit 130 and the ground node GND. The transistor n9 is coupled between the output node N5 and the transistor nx9, and is controlled by the second input signal IN. The transistor nx9 is coupled between the transistor n9 and the ground node GND, and is controlled by the control signal nvih that is output by the logic circuit 140. The transistors n9 and nx9 of the configurable circuit 130 are turned on or turned off to support different I/O supply voltage levels. For example, when the I/O voltage level is a first or second predefined voltage level (i.e., 1.8V or 1.2V), the control signal nvih is configured to turn off the transistor nx9. When the I/O voltage level is a third predefined voltage level (i.e., 0.9V), the control signal nvih is configured to turn on the transistor nx9. It is appreciated that the values of the first, second and third predefined voltage levels are given as an example only, and the disclosure does not intend to limit the values of the first, second and third predefined voltage levels to any specific values.

The logic circuit 150 may receive configuration bits cfg_vihl <0> and bit cfg_vihl <1> of the configuration signal bit cfg_vihl as inputs, and perform a logic operation on the configuration bits cfg_vihl <0> and bit cfg_vihl <1> to generate an enable signal Ls_enb. The logic circuit 150 may be an AND logic gate in an embodiment, but the disclosure is not limited thereto. The enable signal Ls_enb is provided to the level-shift circuit 130.

The level-shift circuit 130 may include a plurality of transistors p2, p3, p4, p5, n2, n5, px5 and nxr0. The transistors p2, p3 and n2 are coupled in series between a node that supplies a supply voltage VDD and a ground node that supplies the ground voltage GND. The transistors p3 and n2 are controlled by the second input voltage IN, and transistor p2 is controlled by an output signal out at the output node N6 of the level-shift circuit 130. The transistors px5, p4, p5 and n5 are coupled in series between the node that supplies the supply voltage VDD and the node that supplies the ground voltage GND. The transistor p5 and n5 are controlled by the input signal INb, the transistor p4 is controlled by an output signal outb at the output terminal N5 of the level-shift circuit 130, and the transistor px5 is controlled by the enable signal Ls_enb. The transistor nxr0 of the level-shift circuit 130 is coupled between the output node N6 and the ground node GND, and the transistor nxr0 is controlled by the enable signal Ls_enb. The level-shift circuit 130 is configured to output the output signal outb at the output node N5 to the control logic circuit 200.

The level-shift circuit 130 may function as an inverter or a level shifter according to a logic state of the enable signal Ls_enb provided by the logic circuit 150. When the enable signal Ls_enb is in a first logic state (i.e., logic "1"), the transistor px5 is turned off and the transistor nxr0 is turned on. As a result, the level-shift circuit 130 functions as the inverter when the enable signal Ls_enb is in a first logic state (i.e., logic "1"). When the enable signal Ls_enb is in a second logic state (i.e., logic "0"), the transistor px5 is turned on and the transistor nxr0 is turned off. As a result, the level-shift circuit 130 functions as the level shifter that causes the voltage level of the output voltage outb being different from the voltage level of the second input voltage IN when the enable signal Ls_enb is in a second logic state (i.e., logic "0").

Operations of the level-shift buffer device 100 are described below. For the sake of simplicity, it assumes that the configuration signal cfg_vihl is a two-bit configuration signal cfg_vihl<1:0>; the logic control circuit 200 operates with the voltage level of 1.8V; the I/O supply voltage may have various voltage levels including 0.9V, 1.2V and 1.8V; the voltage level of the supply voltage VDD is 1.8V; and the voltage level of the supply voltage Vddq can be 1.8V, 1.2V or 0.9V It is appreciated that the disclosure does not intend to be limited to the above-mentioned values. For example, in some alternative embodiments, the configuration signal cfg_vihl may be a single-bit configuration signal or a n-bit configuration signal, in which n is an integer greater than two. In some embodiments, the various voltage levels of the I/O voltage may be in a higher range or a lower range than the above-mentioned range of the I/O voltage levels. For example, the voltage levels of the I/O voltage may be (3.6V, 2.5V and 1.8V) or (1.2V, 0.8V and 0.6V). In some embodiments, the range of the I/O voltage levels may be wider or narrower than the above-mentioned range. For example, the I/O voltage levels may be (3.6V, 2.5V, 1.8V, 1.2V, 0.8V, 0.6V, etc).

In operations, the level-shift buffer device 100 may support various voltage levels of the I/O supply voltage Vddq in accordance with the configuration bits cfg_vihl <1:0>. When the configuration bits cfg_vihl <1:0> are "11", the level-shift buffer device 100 may support the I/O supply voltage with a first predefined voltage level (i.e., 1.8V), and output the output voltage outb with the same voltage level as the voltage level of the I/O supply voltage. More specifically, when the configuration bits cfg_vihl <1:0> are "11", the logic circuit 140 outputs the control signal nvih with a low logic state (i.e., logic state "0"), and the logic circuit 150 outputs the enable signal Ls_enb with a high logic state (i.e., logic state "1"). In the configurable circuit 120, the transistor px1 is turned off by the configuration bit cfg_vihl <0>, the transistor nx1 is turned on by the configuration bit cfg_vihl <0>, and the transistor nx9 is turned off by the control signal nvih. The transistors p0, n0, n1 and nx1 of the configurable circuit 120 operate to generate the second input signal IN with the same voltage level (i.e., 1.8V) as the voltage level of the first input signal INb. Meanwhile, the transistor px5 in the level-shift circuit 130 is turned off and the transistor nxr0 in the level-shift circuit 130 is turned on by the enable signal Ls_enb. Accordingly, the level-shift circuit 130 functions as an inverter that generates the output signal outb with the same voltage level (i.e., 1.8V) as the voltage level of the I/O supply voltage level. In this way, the level-shift buffer device 100 may support the first predefined I/O voltage level (i.e., 1.8V) when the configuration bits cfg_vihl <1:0> are "11".

When the configuration bits of the configuration signal cfg_vihl are "10", the level-shift buffer device 100 may support the I/O supply voltage with a second predefined voltage level (i.e., 1.2V), and output the voltage outb with the voltage level (i.e., 1.8V) of the operating voltage of the control logic circuit 200. More specifically, when the configuration bits cfg_vihl <1:0> are "10", the logic circuit 140 outputs the control signal nvih with the low logic state (i.e., logic state "0"), and the logic circuit 150 outputs the enable signal Ls_enb with the low logic state (i.e., logic state "0"). In the configurable circuit 120, the transistor px1 is turned on by the configuration bit cfg_vihl <0>, the transistor nx1 is turned off by the configuration bit cfg_vihl <0>, and the transistor nx9 is turned off by the control signal nvih. The transistors p0, n0, p1 and px1 of the configurable circuit 120 operate to generate the second input signal IN with the second predefined I/O voltage level (i.e., 1.2V). Meanwhile, the transistor px5 in the level-shift circuit 130 is turned on and the transistor nxr0 in the level-shift circuit 130 is turned off by the enable signal Ls_enb. As a result, the level-shift circuit 130 functions as a level shifter that shifts the voltage level of the second input signal IN from the second predefined voltage level (i.e., 1.2V) to match an operating voltage (i.e., 1.8V) of the control logic circuit 200. In this way, the level-shift buffer device 100 may support the second predefined voltage level (i.e., 1.2V) when the configuration bits cfg_vihl <1:0> are "10". The operation of the transistor px1 in the configurable circuit 120 may reduce signal rise and fall time skew or reducing duty cycle distortion (DCD). More specifically, when the transistor px1 is turned on, the pull-up current may flow from the connection node N1 to the connection node N2 through both the transistor p0 and a path formed by the transistors px1 and p1. In this way, the signal rise and fall time skew is reduced and the speed performance of the level-shift buffer device 100 is improved.

When the configuration bits of the configuration signal cfg_vihl are "00", the level-shift buffer device 100 is configured to support a third predefined voltage level (i.e., 0.9 V). More specifically, when the configuration bits cfg_vihl <1:0> are "00", the logic circuit 140 outputs the control signal nvih with the high logic state (i.e., logic state "1"), and the logic circuit 150 outputs the enable signal Ls_enb with the low logic state (i.e., logic state "0"). In the configurable circuit 120, the transistor px1 is turned on by the configuration bit cfg_vihl <0>, the transistor nx1 is turned off by the configuration bit cfg_vihl <0>, and the transistor nx9 is turned on by the control signal nvih. The transistors p0, n0, p1, px1, n9 and nx9 of the configurable circuit 120 operate to generate the second input signal IN with the third predefined I/O voltage level (i.e., 0.9V). Meanwhile, the transistor px5 in the level-shift circuit 130 is turned on and the transistor nxr0 in the level-shift circuit 130 is turned off by the enable signal Ls_enb. As a result, the level-shift circuit 130 functions as a level shifter that shifts the voltage level of the second input signal IN from the third predefined I/O voltage level (i.e., 0.9V) to match an operating voltage (i.e., 1.8V) of the control logic circuit 200. In this way, the level-shift buffer device 100 may support the third predefined I/O voltage level (i.e., 0.9V) when the configuration bits cfg_vihl <1:0> are "00". The operation of the transistor px1 and nx9 in the configurable circuit 120 may reduce signal rise and fall time skew or reducing duty cycle distortion (DCD) and improve speed performance of the level-shift buffer device 100. Furthermore, the operations of the transistors n9 and nx9 may reduce trip voltage (Vtrip) of the level-shift circuit 130 to compensate for extremely low I/O supply voltage level (such as third predefined I/O voltage level). A voltage level that is less than or equal to a half of the supply voltage Vdd is considered as an extremely low I/O supply voltage level.

Figure 3:
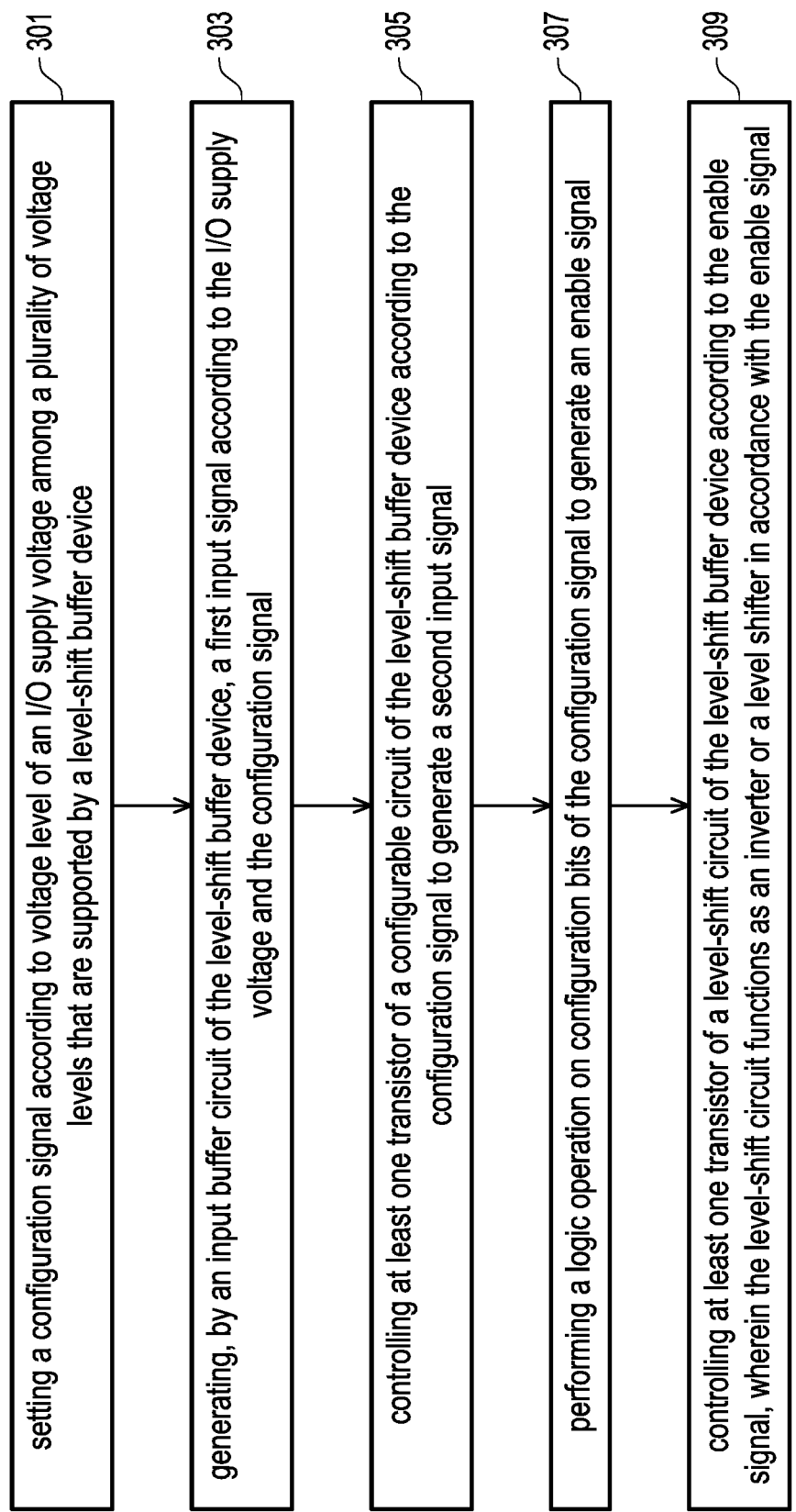
FIG. 3 is a flowchart diagram of an operating method of a level-shift buffer device in accordance with some embodiments.

FIG. 3 illustrates an operating method of a level-shift buffer device (i.e., the level-shift buffer device in FIG. 1 and FIG. 2) in accordance with some embodiments. In block 301, a configuration signal is set according to voltage level of an I/O supply voltage among a plurality of voltage levels that are supported by the level-shift buffer device. Referring to FIG. 2 and FIG. 3, the configuration bits cfg_vihl <1:0> may be set in accordance with the voltage level of the I/O supply voltage Vddq supplied to the level-shift buffer device 100. In block 303, a first input signal is generated by an input buffer circuit of the level-shift buffer device according to the I/O supply voltage and the configuration signal. Referring to FIG. 2 and FIG. 3, the first input signal INb is generated by an input buffer circuit 110 of the level-shift buffer device 100 according to the I/O supply voltage Vdd and the configuration signal cfg_vihl. In block 305, at least one transistor of a configurable circuit of the level-shift buffer device is controlled according to the configuration signal to generate a second input signal. Referring to FIG. 2 and FIG. 3, the transistors px1, nx1 and nx9 of the configurable circuit 120 may be controlled according to the configuration signal cfg_vihl to generate the second input signal IN. In block 307, a logic operation is performed on configuration bits of the configuration signal to generate an enable signal. Referring to FIG. 2 and FIG. 3, the logic operation (i.e., AND logic operation) is performed on configuration bits cfg_vihl<1> and cfg_vihl<0> to generate an enable signal Ls_enb. In block 309, at least one transistor of a level-shift circuit of the level-shift buffer device is controlled according to the enable signal, wherein the level-shift circuit functions as an inverter or a level shifter in accordance with the enable signal. Referring to FIG. 2 and FIG. 3, the transistors px5 and nxr0 of the level-shift circuit 130 are controlled according to the enable signal Ls_enb. The level-shift circuit 130 functions as an inverter or a level shifter in accordance with the enable signal Ls_enb. For example, when the enable signal Ls_enb is in a first logic state (i.e., logic state "1"), the level-shift circuit 130 functions as the inverter; and when the enable signal Ls_enb is in a second logic state (i.e., logic state "0"), the level-shift circuit 130 functions as the level shifter. In this way, the operating method of the level-shift buffer device allows the level-shift buffer device to support various I/O supply voltage levels with less signal rise and fall time skew and improved speed performance of the level-shift buffer device.

In accordance with the above embodiments, a level-shift buffer device that is configured to support various I/O supply voltage levels according to a configuration signal is introduced. An input buffer circuit of the level-shift buffer device may receive I/O supply voltage with various voltage levels. The input buffer circuit may further receive a control signal that is generated according to a configuration bit of the configuration signal to control finger transistors of the input buffer circuit, thereby reducing trip voltage of the input buffer circuit for supporting extremely low I/O supply voltage level. A configurable circuit of the level-shift buffer device may control at least one transistor according to the configuration signal to support various I/O supply voltage levels. Operations of the at least one transistor of the configurable circuit may contribute to a reduction of signal rise and fall time skew and improvement of high-speed performance of the level-shift buffer device. A level-shift circuit of the level-shift buffer device may function as an inverter or a level shifter according to the configuration signal. In this way, the level-shift buffer device may support various I/O supply voltage levels while reducing signal rise and fall time skew and improving operating speed of the level-shift buffer device. Since the level-shift buffer device does not use metal options as the conventional designs, the level-shift buffer device is smaller-in-size and faster in operating speed than the conventional designs. Accordingly, the manufacturing cost and the time to market of the product is reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A level-shift buffer device, comprising:
an input buffer circuit, receiving input/output (I/O) supply voltage at a first voltage level among a plurality of voltage levels that are supported by the level-shift buffer device, and generating a first input signal according to the first voltage level of the I/O supply voltage;
a configurable circuit, receiving the first input signal and a configuration signal, controlling at least one transistor of the configurable circuit according to the configuration signal to generate a second input signal; and
a level-shift circuit, generating an output signal at a second voltage level according to the second input signal and the configuration signal, wherein the level-shift circuit functions as an inverter or a level shifter in accordance with the configuration signal.

2. The level-shift buffer device according to claim 1, wherein
the configuration signal comprises configuration bits;
when the configuration bits of the configuration signal are first predefined bit values, the level-shift circuit functions as the inverter, and
when the configuration bits of the configuration signal are second predefined bit values, the level-shift circuit functions as the level shifter.

3. The level-shift buffer device according to claim 2, further comprising:
a logic circuit, receiving the configuration bits, and performing a logic operation on the configuration bits to generate an enable signal, and
the level-shift circuit functions as the inverter or the level shifter in accordance with a logic state of the enable signal.

4. The level-shift buffer device according to claim 3, wherein the logic circuit is an AND gate.

5. The level-shift buffer device according to claim 3, wherein the level-shift circuit comprises:
a first transistor, coupled to a power supply terminal, controlled by the enable signal; and
a second transistor, coupled between an output terminal of the level-shift circuit and a ground terminal, controlled by the enable signal, wherein
when the enable signal is a first logic state, the first transistor is turned off, the second transistor is turned on, and the level-shift circuit functions as the inverter,
when the enable signal is a second logic state, the first transistor is turned on, the second transistor is turned off, and the level-shift circuit functions as the level shifter.

6. The level-shift buffer device according to claim 5, wherein
the first transistor is a p-type transistor, and
the second transistor is a n-type transistor.

7. The level-shift buffer device according to claim 2, wherein the configurable circuit comprises:
a pair of p-type transistors, connected in parallel between a first connection node and a second connection node, and controlled by the first input signal; and
a pair of n-type transistors, connected in parallel between the second connection node and a ground node, and controlled by the first input signal.

8. The level-shift buffer device according to claim 7, wherein the configurable circuit further comprises:
a p-type transistor, connected to one p-type transistor of the pair of p-type transistors, and controlled by a first configuration bit among the configuration bits of the configuration signal; and
a first n-type transistor, connected in series to one n-type transistor of the pair of n-type transistors, and controlled by the first configuration bit among the configuration bits of the configuration signal.

9. The level-shift buffer device according to claim 2, wherein the configurable circuit further comprises:
a second n-type transistor, controlled by the second input signal; and
a third n-type transistor, coupled between second n-type transistor and the ground node, controlled by a control signal.

10. The level-shift buffer device according to claim 9, further comprising:
an inverter, converting a second configuration bit among the configuration bits to generate the control signal.

11. The level-shift buffer device according to claim 9, wherein the second n-type transistor and the third n-type transistor are used to lower a level of a trip voltage of the level-shift circuit.

12. An operating method, comprising:
setting a configuration signal according to voltage level of an I/O supply voltage among a plurality of voltage levels that are supported by a level-shift buffer device;
generating, by an input buffer circuit of the level-shift buffer device, a first input signal according to the I/O supply voltage and the configuration signal;
controlling at least one transistor of a configurable circuit of the level-shift buffer device according to the configuration signal to generate a second input signal;
performing a logic operation on configuration bits of the configuration signal to generate an enable signal; and
controlling at least one transistor of a level-shift circuit of the level-shift buffer device according to the enable signal, wherein the level-shift circuit functions as an inverter or a level shifter in accordance with the enable signal.

13. The operating method according to claim 12, wherein:
the level-shift circuit functions as the inverter when configuration bits of the configuration signal are first predefined bit values; and
the level-shift circuit functions as the level shifter when configuration bits of the configuration signal are second predefined bit values.

14. The operating method according to claim 12, wherein performing the logic operation on the configuration bits to generate the enable signal comprises:
performing an AND logic operation on the configuration bits to generate the enable signal.

15. The operating method according to claim 12, wherein controlling the at least one transistor of the level-shift circuit of the level-shift buffer device according to the enable signal comprises:
controlling a first transistor and a second transistor of the level-shift circuit according to the enable signal.

16. The operating method according to claim 15, wherein controlling the first transistor and the second transistor of the level-shift circuit according to the enable signal comprises:
turning off the first transistor and turning on the second transistor of the level-shift circuit when the enable signal is a first logic state to function the level-shift circuit functions as the inverter; and
turning on the first transistor and turning off the second transistor of the level-shift circuit when the enable signal is a second logic state to function the level-shift circuit functions as the level shifter.

17. The operating method according to claim 12, wherein controlling the at least one transistor of the configurable circuit of the level-shift buffer device according to the configuration signal to generate the second input signal comprises:

controlling a p-type transistor and a first n-type transistor of the configurable circuit according to a first configuration bit among the configuration bits of the configuration signal.

18. The operating method according to claim 17, wherein controlling the at least one transistor of the configurable circuit of the level-shift buffer device according to the configuration signal to generate the second input signal further comprises:
converting a second configuration bit among the configuration bits to generate a control signal; and
controlling a second n-type transistor and a third n-type transistor of the configurable circuit according to the control signal.

19. A system, comprising:
a register/detector circuit, generating a configuration signal;
a level-shift buffer device, coupled to register/detector circuit to receive the configurable circuit, the level-shift buffer device comprises:
an input buffer circuit, receiving input/output (I/O) supply voltage at a first voltage level among a plurality of voltage levels that are supported by the level-shift buffer device, and generating a first input signal according to the first voltage level of the I/O supply voltage;
a configurable circuit, receiving the first input signal and the configuration signal, controlling at least one transistor of the configurable circuit according to the configuration signal to generate a second input signal; and
a level-shift circuit, generating an output signal at a second voltage level according to the second input signal and the configuration signal, wherein the level-shift circuit functions as an inverter or a level shifter in accordance with the configuration signal; and
a control logic circuit, coupled to the level-shift buffer device, operating according to the output signal at the second voltage level.

20. The system according to claim 19, wherein the register/detector circuit comprises:
a non-volatile configuration register, storing the configuration signal; and
a voltage detector, detecting the first voltage level of the I/O supply voltage; and
a logic circuit, coupled to the non-volatile configuration register and the voltage detector, performing a logic operation on an output of the non-volatile configuration register and an output of the voltage detector to generate the configuration signal.

* * * * *